United States Patent
Cruz et al.

(10) Patent No.: US 6,396,316 B1
(45) Date of Patent: May 28, 2002

(54) CLOCK BUFFER WITH LC CIRCUIT FOR JITTER REDUCTION

(75) Inventors: Jose M. Cruz, Palo Alto; Robert J. Bosnyak, San Jose, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/667,060

(22) Filed: Sep. 21, 2000

(51) Int. Cl.[7] .................................................. H03B 1/00
(52) U.S. Cl. ........................................ 327/112; 327/111
(58) Field of Search ........................ 327/108–112, 379, 327/382, 386, 557, 551

(56) References Cited

U.S. PATENT DOCUMENTS

| | | | | |
|---|---|---|---|---|
| 5,392,039 A | * | 2/1995 | Thurston | 341/143 |
| 5,731,722 A | * | 3/1998 | Sugiki et al. | 327/111 |
| 5,982,355 A | * | 11/1999 | Jaeger et al. | 345/161 |
| 6,005,281 A | * | 12/1999 | Conboy et al. | 257/531 |
| 6,016,082 A | * | 1/2000 | Cruz et al. | 331/117 |
| 6,150,894 A | * | 11/2000 | Seng et al. | 331/175 |
| 6,275,113 B1 | * | 8/2001 | Nakano et al. | 330/305 |

* cited by examiner

Primary Examiner—Kenneth B. Wells
Assistant Examiner—Cassandra Cox
(74) Attorney, Agent, or Firm—Weingarten, Schurgin, Gagnebin & Lebovici LLP

(57) ABSTRACT

A clock buffer circuit utilizing an LC circuit for jitter reduction. The circuit includes a differential amplifier that is coupled to a buffer stage. The output of the buffer circuit comprises the buffer stage output. An inductor and capacitor are coupled between the buffer stage output and ground. The values of the inductor and capacitor are specified such that the resonant frequency of the LC circuit corresponds to the nominal clock frequency. The entire buffer circuit including the capacitor and inductor may be fabricated on an integrated circuit. Alternatively the capacitor and/or inductor may comprise discrete components that are coupled to the buffer stage output. Additionally, multiple capacitors and/or inductors may be fabricated on the integrated circuit to permit the resonant frequency of the LC circuit to be adjusted to match the nominal clock frequency. The capacitor(s) and/or inductor(s) on the integrated circuit may be connected to integrated circuit contacts and coupled to the buffer stage output via external connections or alternatively, via semiconductor switches.

16 Claims, 2 Drawing Sheets

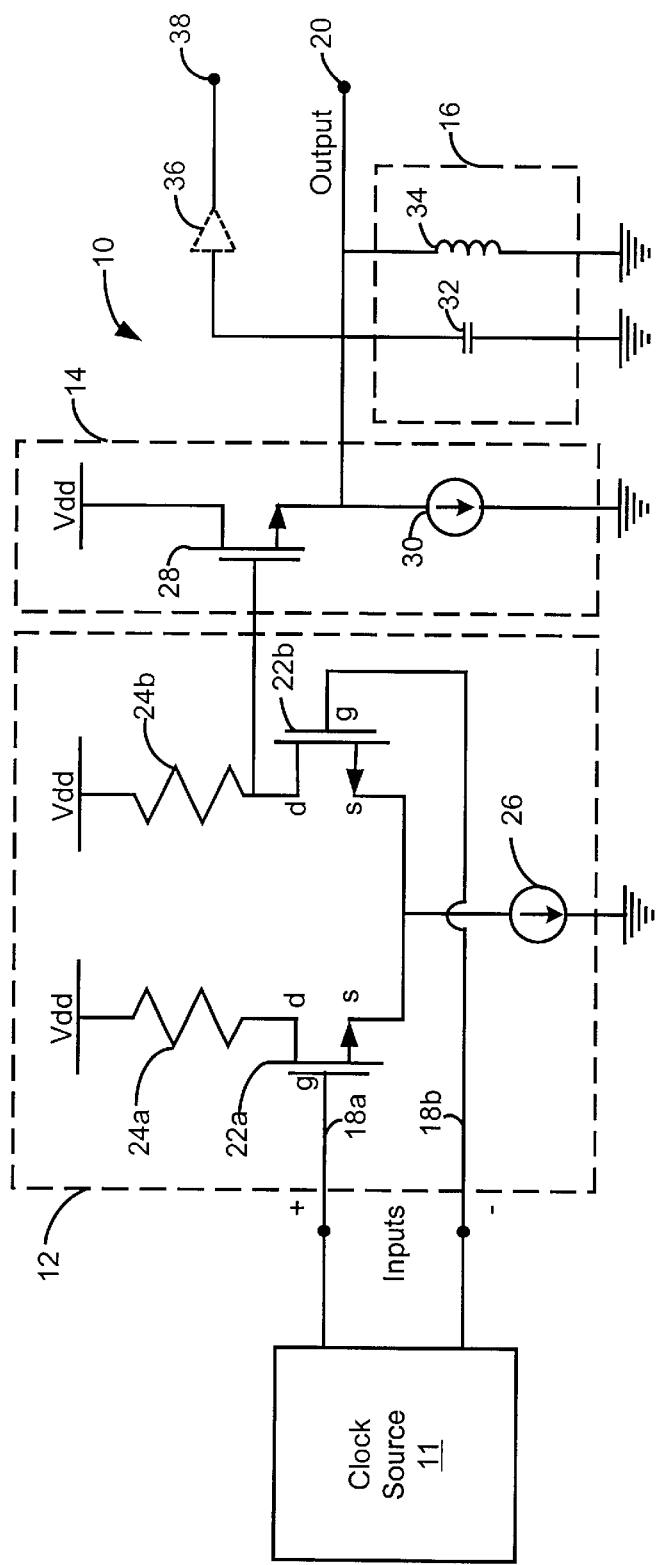
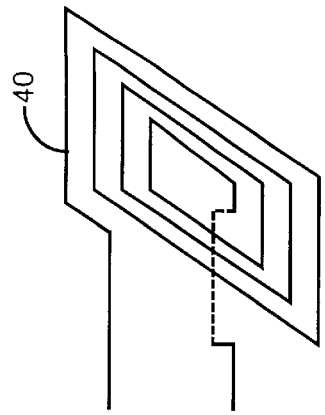
Fig. 1
Fig. 2

CLOCK BUFFER WITH LC CIRCUIT FOR JITTER REDUCTION

BACKGROUND OF THE INVENTION

The present invention relates to clocked electronic circuits and more particularly to a clock buffer circuit that includes an LC circuit to reduce jitter in the clock circuit output frequency.

In computer systems, networking equipment, and numerous other types of electronic equipment, system clocks are commonly used. The system clocks are often buffered and distributed throughout the system for use by processors, memories, DMA controllers, arbitration logic, and many other components, boards and systems that require an accurate frequency. To provide adequate fan-out from the source of the system clock, several stages of buffers are often used. It is well known that such buffer stages can introduce undesirable jitter into the clock signal. The jitter can result from clock transitions that occur sooner or later than normally expected. While jitter can occur for a number of reasons, it is understood that variations in the power supply voltage can result in clock litter.

Problems associated with jitter become worse as the clock frequencies that are employed increase. Moreover, with faster circuits, cycle times are reduced. The reduction in cycle times often mandates reductions in jitter specifications to achieve reliable operation.

Currently, when it is necessary to provide a clock with very low jitter characteristics, a phase locked loop (PLL) is employed. PLLs, however, tend to be complex, costly, and require substantial board area for the components necessary to implement the PLL. In view of the space and cost considerations associated with the use of PLLs to reduce clock jitter, their use is often limited.

Accordingly, it would be desirable to have a low cost and reliable jitter reduction clock buffer circuit that may be fabricated on an integrated circuit and used throughout clocked electronic devices.

BRIEF SUMMARY OF THE INVENTION

A circuit and method for reducing clock jitter at the output of a clock buffer is disclosed. The clock buffer includes an input stage amplifier and a buffer stage. In a preferred embodiment, the input stage amplifier comprises a differential amplifier that receives differential inputs from a clock source. The differential amplifier is coupled to an input of the buffer stage. The buffer stage has an output that comprises the clock buffer output. The buffer stage output is coupled to the clocked load. The buffer stage output is also coupled to an LC circuit. More specifically, an inductor and a capacitor are coupled between the buffer stage output and a ground node of the clock buffer. The values of the inductor and capacitor are specified so as to create a resonant circuit having a resonant frequency equal to the desired clock frequency. The LC circuit acts as a bandpass filter and reduces the frequency components away from the desired frequency of operation.

In a preferred embodiment, the inductor and the capacitor forming the LC resonant circuit are fabricated in silicon along with the clock buffer. Alternatively, either one or both of the components may be discrete or off chip components that are coupled to the clock buffer output.

Additionally, to permit tuning of the resonant LC circuit to the desired clock frequency, plural capacitors and/or inductors may be fabricated on-chip and selected capacitors and/or inductors coupled between the clock buffer output and ground to achieve the desired bandpass frequency. The capacitors and/or inductors may have interconnects to the clock buffer output made external to the chip or alternatively, via semiconductor switches that are located on-chip but controlled via external control signals.

Other features, aspects and advantages of the presently disclosed clock buffer circuit for reducing clock jitter will be apparent from the Detailed Description of the Invention that follows.

BRIEF DESCRIPTION OF THE SEVERAL VIEWS OF THE DRAWING

The invention will be more fully understood by reference to the following Detailed Description of the Invention in conjunction with the Drawing of which:

FIG. 1 is a schematic diagram of a jitter reducing clock buffer circuit operative in a manner consistent with the present invention;

FIG. 2 is a pictorial representation of a spiral inductor that may be fabricated on-chip in an integrated jitter reducing clock buffer circuit such as depicted in FIG. 1.

DETAILED DESCRIPTION OF THE INVENTION

Figure 3:
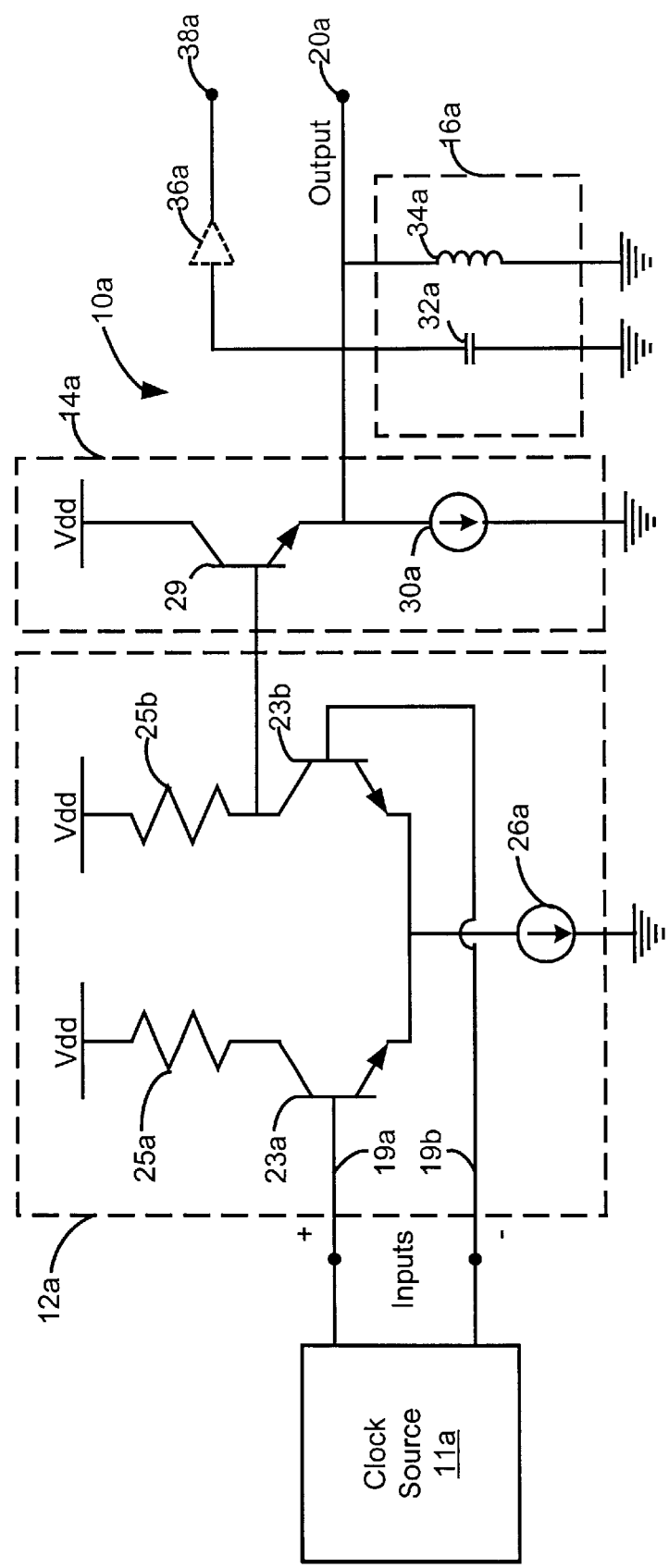
FIG. 3 is an alternative embodiment of the jitter reducing clock buffer circuit of FIG. 1 using bipolar transistors.

Consistent with the present invention a jitter reducing clock buffer circuit is disclosed. The clock buffer circuit employs an LC circuit coupled to the output of a clock buffer. The LC circuit is resonant at the nominal operating clock frequency and acts as a bandpass filter that allows the nominal clock frequency to pass while reducing the frequency components that are away from the nominal operating clock frequency.

Referring to FIG. 1 the jitter reducing clock buffer circuit 10 has inputs, which in the illustrated embodiment, comprise differential inputs 18a and 18b, that receive differential clock signals from a clock source 11. The clock source 11 may comprise a clock generator that generates a clock signal at a nominal clock frequency or alternatively, another clock buffer circuit. The clock buffer circuit 10 produces an output signal 20.

The illustrated clock buffer circuit 10 includes a differential amplifier stage 12, a buffer stage 14 and an LC circuit 16. The differential amplifier 12 includes first and second n-channel MOSFETs 22a and 22b having respective drains coupled to a supply voltage vdd through resistors 24a and 24b. The source terminals of the MOSFETs 22a and 22b are connected together. A current source 26 is provided between the coupled source terminals of the MOSFETs 22a and 22b and the ground node. The differential amplifier stage has a differential stage output at the drain of the MOSFET 22b. The differential output of the clock source 11 or another clock buffer circuit is coupled to the differential inputs 18a and 18b of the clock buffer circuit 10. Differential voltage swings produced by the clock source 11 drive the inputs 18a and 18b of the differential amplifier stage 12 and produce a generally square wave output at the output of the differential stage 12.

The output of the differential amplifier stage 12 is coupled to the input of the buffer stage 14, which in the illustrated embodiment comprises a source follower stage employing an n-channel MOSFET 28. The output of the differential amplifier stage 12 is coupled to the gate of the n-channel MOSFET 28. The drain of the n-channel MOSFET 28 is coupled to the supply voltage vdd and the source of the n-channel MOSFET 28 is coupled to a current source 30 that in turn is coupled to the ground node. The output signal 20 of the jitter reducing clock buffer circuit 10 is taken from the source of the n-channel MOSFET 28. An optional buffer 36 may be coupled to the output 20 to produce a buffered output signal 38. The buffer 36 serves to square up the output waveform 20.

A capacitance 32 and an inductance 34 are provided between the output 20 of the buffer stage 14 and the ground node. The values of one or more capacitors that make up the capacitance 32 and one or more inductors that make up the inductance 34 are selected such that the resonant frequency of the LC circuit 16 equals the nominal clock frequency driving the jitter reducing clock buffer circuit 10. Moreover, a variable capacitive element, such as a varactor, may be employed as the capacitance 32 or one or several capacitors comprising the capacitance 32 to allow adjustment of the capacitance 32 under the control of a control signal.

The clock buffer circuit 10 may be implemented using discrete components or preferably, as an integrated circuit. Alternatively, the clock buffer circuit 10 may be integrated and the capacitance 32 and the inductance 34 may be obtained using off-chip components. Finally, the capacitance 32 or the inductance 34 may be provided via an on-chip component with the other provided as an off-chip component.

An exemplary clock buffer circuit 10 includes resistors 24a and 24b in the differential amplifier stage 12 having a value of 100Ω. N-channel MOSFETs 22a and 22b have a channel width of 40 μm and a channel length of 0.6 μm and the current source 26 comprises a 5 milliamp current source. In the buffer stage 14, an exemplary n-channel MOSFET 28 may have a channel width of 100 μm and a channel length of 0.6 μm and the current source 30 may comprise a 5 milliamp current source. The capacitance 32 may comprise a 12.7 pf capacitor that is fabricated on-chip and the inductance 34, in an exemplary embodiment depicted in FIG. 2, comprises a 2 nH spiral inductor that is fabricated on-chip. The 2 nH inductor may be obtained in a spiral inductor using approximately 3 turns in an area of 0.04 sq. mm. Accuracy in the value of the inductance is dependent on the lithography techniques employed and typically yield a value within 1% of the nominal value. While the above described values have been selected to achieve a jitter reducing clock buffer circuit 10 adapted for buffering clock signals operating at a nominal value of approximately 1 gigahertz, it should be appreciated that the values within the LC circuit may be selected for any desired nominal clock operating frequency. The values identified above are intended to be exemplary. It will be appreciated by those of ordinary skill that variations in such values may be readily made without departing from the concepts described herein.

The capacitance and/or inductance may each be fabricated on-chip as single components or alternatively as plural components to permit tuning of the LC circuit 16 to the nominal clock frequency. For example, a series of capacitors may be fabricated on-chip with each capacitor having a value equal to half the value of the next largest capacitor. The individual capacitors may be selectably coupleable to the output 20 via off-chip connections or alternatively, via MOSFET switches that are provided on chip, to achieve a desired capacitance 32 within a specified range. Additionally, a series of inductors may be fabricated on-chip with each inductor having a value equal to half the value of the next largest inductor. The individual inductors may be selectably coupleable to the output 20 via off-chip connections or alternatively, via MOSFET switches that are provided on chip, to achieve a desired inductance 34 within a specified range. For ease of fabrication, all of the capacitors may be fabricated with the identical structure to provide capacitors and the desired values obtained by paralleling a specified number of capacitors. By way of example, assume that it is desired to have the ability to selectably couple one or more capacitors having values, 1C, 2C, 4C and 8C in parallel between the buffer circuit capacitor and the ground node. In this circumstance 15 capacitors of value C could be fabricated on chip using the identical capacitor structure and one of the capacitors could be selectably coupled to the output to achieve the 1C value, 2 paralleled capacitors could be coupled to the output 20 to achieve the 2C value, etc. Thus, values of C between 1C and 15C may be provided. A similar result may be obtained by fabricating plural inductors on chip and connecting inductors in series to achieve larger inductance values. Additionally, one or more continuously variable capacitors, as known in the art, may be employed as the capacitance 32 within the LC circuit 16. As indicated above, a variable capacitor may be employed as one of plural capacitive elements to allow variation of the capacitance value under the control of a control signal.

While the embodiment depicted in FIG. 1 employs n-channel MOSFETS as the active elements, it will be appreciated by those of ordinary skill in the art that other active elements may be substituted. For example, P-channel MOSFETs, CMOS, JFETS, bipolar and other active elements may be used to produce the presently disclosed jitter reducing clock buffer circuit.

FIG. 3 illustrates an illustrative embodiment of a clock buffer circuit 10a for reducing clock jitter that employs bipolar transistors as the active elements rather than n-channel MOSFET devices. More specifically, in the buffer circuit 10a it is noted that bipolar transistors 23a, 23b and 29 have been substituted for the MOS transistors 22a, 22b and 28 respectively. The operation of the clock buffer circuit 10a depicted in FIG. 3 is generally as described above with respect to FIGS. 1 and 2.

Referring to FIG. 3 the jitter reducing clock buffer circuit 10a has inputs, which in the illustrated embodiment, comprise differential inputs 19a and 19b, that receive differential clock signals from a clock source 11a. The clock source 11a may comprise a clock generator that generates a clock signal at a nominal clock frequency or alternatively, another clock buffer circuit. The clock buffer circuit 10a produces an output signal 20a.

The illustrated clock buffer circuit 10a includes a differential amplifier stage 12a, a buffer stage 14a and an LC circuit 16a. The differential amplifier 12a includes first and second n-channel npn bipolar transistors 23a and 23b having respective collectors coupled to a supply voltage vdd through resistors 25a and 25b. The emitters of the transistors 23a and 23b are connected together. A current source 26a is provided between the coupled emitters of the transistors 23a and 23b and the ground node. The differential amplifier stage 12a has a differential stage output at the collector of the transistor 23b. The differential output of the clock source 11a or another clock buffer circuit (not shown) is coupled to the differential inputs 19a and 19b of the clock buffer circuit 10a. Differential voltage swings produced by the clock source 11a drive the inputs 19a and 19b of the differential amplifier stage 12a and produce a generally square wave output at the output of the differential stage 12a.

The output of the differential amplifier stage 12a is coupled to the input of the buffer stage 14a, that in the illustrated embodiment comprises an emitter follower stage employing an npn transistor 29. The output of the differential amplifier stage 12a is coupled to the base of the transistor 29. The collector of the transistor 29 is coupled to the supply voltage vdd and the emitter of the transistor 29 is coupled to a current source 30a that in turn is coupled to the ground node. The output signal 20a of the jitter reducing clock buffer circuit 10a is taken from the source of the n-channel MOSFET 28. An optional buffer 36a may be coupled to the output 20a to produce a buffered output signal 38a. The optional buffer 36a serves to square up the output waveform 20a.

A capacitance 32a and an inductance 34a are provided between the output 20a of the buffer stage 14a and the ground node. The values of one or more capacitors that make up the capacitance 32a and one or more inductors that make up the inductance 34a are selected as discussed above in conjunction with FIG. 1.

Those of ordinary skill in the art will further appreciate that variations to and modification of the above-described jitter reducing clock buffer circuit may be made without departing from the inventive concepts disclosed herein. Accordingly, the invention should not be viewed as limited except as by the scope and spirit of the appended claims.

What is claimed is:

1. A buffer circuit for reducing clock jitter comprising:
    a buffer having at least one input for receiving at least one input clock signal having a nominal clock frequency and further having a buffer output, said buffer being operative to provide an output clock signal at said buffer output responsive to the receipt of said at least one input clock signal;
    at least one inductive element having an inductance value, said at least one inductive element being coupled between said buffer output and a first low impedance node of said buffer circuit; and
    at least one capacitive element having a capacitance value, said at least one capacitive element being coupled between said buffer output and a second low impedance node of said buffer circuit;
    said at least one inductive element and said at least one capacitive element having a resonant frequency and said inductance value and said capacitance value being specified such that said resonant frequency corresponds to said nominal clock frequency;
    wherein said buffer includes an amplifier stage having an output coupled to an input of a first buffer stage, said at least one input of said buffer comprises at least one input to said amplifier stage and said buffer output comprises an output of said first buffer stage.

2. The buffer circuit of claim 1 wherein said first and second low impedance nodes comprise a circuit ground of said buffer circuit.

3. The buffer circuit of claim 1 wherein said amplifier stage comprises a differential amplifier having first and second inputs.

4. The buffer circuit of claim 1, wherein said at least one capacitive element includes at least one variable capacitor having a capacitance voltage responsive to an input control signal.

5. The buffer circuit of claim 1 further including a second buffer stage having an input coupled to said first buffer stage output, said second buffer stage being operative to produce a buffered representation of said first buffer stage output.

6. A buffer circuit for reducing clock jitter comprising:
    a buffer having at least one input for receiving at least one input clock signal having a nominal clock frequency and further having a buffer output, said buffer being operative to provide an output clock signal at said buffer output responsive to the receipt of said at least one input clock signal;
    at least one inductive element having an inductance value, said at least one inductive element being coupled between said buffer output and a first low impedance node of said buffer circuit; and
    at least one capacitive element having a capacitance value, said at least one capacitive element being coupled between said buffer output and a second low impedance node of said buffer circuit;
    said at least one inductive element and said at least one capacitive element having a resonant frequency and said inductance value and said capacitance value being specified such that said resonant frequency corresponds to said nominal clock frequency;
    wherein at least one of said capacitive element and said inductive element includes plural capacitors and inductors respectively.

7. An integrated clock buffer circuit for reducing jitter comprising:
    a semiconductor die, said die having fabricated thereon:
        a buffer having at least one input for receiving at least one input clock signal having a nominal clock frequency and further having a buffer output, said buffer being operative to provide an output clock signal at said buffer output responsive to the receipt of said at least one input clock signal;
        at least one inductive element having an inductance value, said at least one inductive element being coupled between said buffer output and a ground node of said buffer circuit; and
        said at least one capacitive element having a capacitance value, said at least one capacitive element being coupled between said buffer output and said ground node of said buffer circuit;
        said at least one inductive element and said at least one capacitive element having a resonant frequency and said inductance value and said capacitance value being specified such that said resonant frequency corresponds to said nominal clock frequency;
        wherein at least one capacitive element includes a plurality of capacitive elements and said capacitive elements are selectably coupleable between said buffer output and said ground node.

8. The integrated clock buffer circuit of claim 7 wherein said at least one inductive element comprises a spiral inductor fabricated on said semiconductor die.

9. The integrated clock buffer circuit of claim 7 further including a first plurality of semiconductor switches, each one of said first plurality of semiconductor switches being connected in series with a respective one of said plurality of capacitive elements to form a switchable capacitive series circuit between said buffer output and said ground node, each of said semiconductor switches being further operative in response to a control signal to couple the respective capacitive element between said buffer output and said ground node.

10. The integrated clock buffer circuit of claim 9 wherein said first plurality of semiconductor switches comprise MOSFET switches.

11. The integrated clock buffer circuit of claim 10 wherein said first plurality of semiconductor switches comprise bipolar transistors.

12. An integrated clock buffer circuit for reducing jitter comprising:

a semiconductor die, said die having fabricated thereon:
  a buffer having at least one input for receiving at least one input clock signal having a nominal clock frequency and further having a buffer output, said buffer being operative to provide an output clock signal at said buffer output responsive to the receipt of said at least one input clock signal;
  at least one inductive element having an inductance value, said at least one inductive element being coupled between said buffer output and a ground node of said buffer circuit; and
  at least one capacitive element having a capacitance value, said at least one capacitive element being coupled between said buffer output and said ground node of said buffer circuit;
  said at least one inductive element and said at least one capacitive element having a resonant frequency and said inductance value and said capacitance value being specified such that said resonant frequency corresponds to said nominal clock frequency;
  wherein said at least one inductive element includes a plurality of inductive elements and said inductive elements are selectably connectable between said buffer output and said ground node.

13. The integrated clock buffer circuit of claim 12 further including at least one second semiconductor switch responsive to a control signal, said at least one second semiconductor switch and said plurality of inductive elements being selectably coupleable to form an inductive circuit between said buffer output and said ground node.

14. The integrated clock buffer circuit of claim 13 wherein said at least one second semiconductor switch comprises a MOSFET switch.

15. The integrated clock buffer circuit of claim 14 wherein said at least one second semiconductor switch comprises at least one bipolar transistor.

16. The integrated clock buffer circuit of claim 12 wherein said plurality of inductive elements comprise a plurality of spiral inductors formed on said semiconductor die.

* * * * *